(12) United States Patent
Ohshima et al.

(10) Patent No.: US 6,428,337 B2
(45) Date of Patent: Aug. 6, 2002

(54) SOCKET FOR ELECTRICAL PARTS

(75) Inventors: Hisao Ohshima; Osamu Hachuda; Masahito Ohashi, all of Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/858,541

(22) Filed: May 17, 2001

(30) Foreign Application Priority Data

May 17, 2000 (JP) ........................................ 2000-144482

(51) Int. Cl.[7] ................................................ H01R 33/02
(52) U.S. Cl. ........................................ 439/266; 439/259
(58) Field of Search .............................. 439/266, 263, 439/259, 331, 342, 71, 73

(56) References Cited

U.S. PATENT DOCUMENTS 5,127,837 A * 7/1992 Shah et al. .................... 439/71
5,669,780 A * 9/1997 Fukunaga .................... 439/266
6,106,316 A * 8/2000 Barringer et al. ........... 439/263

* cited by examiner

*Primary Examiner*—P. Austin Bradley
*Assistant Examiner*—Alexander Gilman
(74) *Attorney, Agent, or Firm*—Staas & Halsey LLP

(57) ABSTRACT

A socket for electrical parts is provided with a socket body for accommodating the electrical part. A plurality of contact pins is arranged to the socket body so that a central side contact pin is arranged to the socket body to contact a center side terminal of the electrical part and a peripheral side contact pin is arranged to the socket body to contact a peripheral side terminal of the electrical part. A press unit is arranged to press an upper surface of the peripheral portion towards a bottom surface side thereof so that, if the electrical part is warped, it becomes possible to securely hold the electrical part by the press unit.

15 Claims, 15 Drawing Sheets

SOCKET FOR ELECTRICAL PARTS

BACKGROUND OF THE INVENTION

The present invention relates to a socket for electrical parts for detachably accommodating an electrical part such as a semiconductor device (called as "IC package" hereinafter).

More particularly, the present invention relates to a socket for electrical parts, which is improved for accommodating an electrical part having a center portion and a peripheral portion with bottom surfaces thereof, and having terminals mounted on the bottom surfaces, respectively.

PRIOR ART OF THE INVENTION

As a conventional "socket for electrical parts" of this kind, there is provided an IC socket for detachably accommodating an IC package as "electrical part".

The IC package includes, for example, a PGA (Pin Grid Array) type of IC package which has a rectangular-shaped package body and a large number of pin terminals mounted on a bottom surface of the package body so as to direct toward a lower side thereof.

On the other hand, the IC socket is provided with a socket body for accommodating the IC package and contact pins which are contacted to the pin terminals and separated therefrom. Moreover, the IC socket is provided with a slide plate arranged to the socket body for elastically deforming the contact pins to displace them and an operation member arranged to the socket body to be vertically movable thereto and adapted to slide the slide plate.

When accommodating the IC package, the operation member of the IC package is moved downward and the slide plate located at an original position is slid according to the downward movement of the operation member to elastically deform the contact pins so that the contact pins move away from an insertion area of the IC package.

With the contact pins being moved away from the insertion area, the IC package is mounted on the socket body to be accommodated therein and, after that, the operation member is moved upward so that the slide plate returns to the original position, thereby releasing the elastically deformation force. The release of the elastically deformation force causes the contact pins to return original positions by these elastic forces so that the contact pins contact to the terminals of the IC package so as to be electrically connected thereto.

Now, as the IC package, there is provided a composite package having the above mentioned PGA connection portion and a LGA (Land Grid Array) connection portion which are integrated with each other. The LGA connection portion has a land (metalized portion) on which predetermined terminals, such as plate terminals, are provided for connecting the IC package to a printed circuit board.

In the composite IC package, in cases where, for example, the PGA connection portion is provided on the center side of the IC package and the LGA connection portion is provided on the peripheral side thereof, it is necessary to previously provide, on the IC socket for accommodating the composite IC package, contact pins adapted to contact to the terminals of the PGA connection portion and contact pins adapted to contact to the terminals of the LGA connection portion and to secure each stability of contacting the respective contact pins to the respective terminals of the PGA and LGA connection portions.

However, according to the IC socket for accommodating the composite IC package, when the IC package is made large-sized, the IC package is easy to be warped so that, in cases where the IC package is mounted on the socket body of the IC socket, there is a possibility that the peripheral portion of the IC package rises away from the mounted surface of the socket body.

Therefore, in cases where the IC package has the configuration in that the peripheral side terminals are provided on the bottom surface of the peripheral portion thereof, there is a possibility of bringing about a gap between the peripheral side terminals and the contact pins of the IC socket, to cause a bad-contact therebetween.

SUMMARY OF THE INVENTION

It is therefore an object of the present invention is to provide a socket for an electrical part, which is capable of, even if the IC package is caused to be warped, ensuring a stability of contacting a contact pin of the socket to a terminal of the electrical part, thereby preventing the contact pin and the terminal from being instably contacted.

In order to achieve such object, according to an aspect of the present invention, there is provided a socket for an electrical part having a center portion, a peripheral portion, a first terminal mounted on the center portion and a second terminal mounted on the peripheral portion, the socket comprising:

a socket body for accommodating the electrical part;

a first contact pin arranged to the socket body and adapted to contact the first terminal of the electrical part;

a second contact pin arranged to the socket body and adapted to contact the second terminal of the electrical part; and pressing member for pressing an upper surface of the peripheral portion towards a bottom surface side thereof.

According to the aspect of the invention, because the pressing member is comprised for pressing the upper surface of the peripheral portion of the electrical part towards the bottom surface side thereof, even if the electrical part is warped, it is possible to surely contact a contact portion of the second contact pin to the second terminal of the electrical part at a predetermined contact pressure, thereby securing the stability of contacting the second contact pin to the second terminal of the electrical part.

In an preferred embodiment of the present invention, the pressing means comprises: an operation member arranged to the socket body to be vertically movable; a slide member obliquely arranged to the socket body from an oblique upper side with respect to a surface portion of the socket body to a vicinity of the surface portion thereof, the electrical part being mounted on the surface portion to be accommodated in the socket body; a press member provided to be slidable along the slide member for pressing the upper surface of the peripheral portion; and a movement unit operatively connected to the operation member and the press member so as to move the press member obliquely upward along the slide portion when the operation member is moved downward, the movement unit being adapted to move the press member obliquely downward along the slide portion when the operation member is moved upward so as to press by the press member the upper surface of the peripheral portion of the electrical part.

According to the preferred embodiment of this aspect, as compared with a rotation-type pressing means, it is possible to ensure a pressing force to the electrical part by the press member, which is sufficient to press thereto, thereby making compact a configuration of the pressing means.

That is, assuming that the rotation-type pressing means is configured to rotate a rotation arm having at its one end portion with a press member so as to press the electrical part by the press member, when rotating the rotation arm, if the electrical part is subjected to some kind of force directed upward therefrom, because the rotation arm is easy to be rotated due to the some kind of force, it is hard to efficiently secure a sufficient pressing force.

Then, it is considerable to enlarge the urging force of a spring which urges the rotation arm, but new problems occur such that the unit becomes larger in size when we intend to secure larger operating force of the rotation arm. In addition, because of using the rotation arm having a predetermined length, it is necessary to provide a rotating space of the rotation arm, thereby causing the whole size of the electrical part to be large-sized.

On the contrary, in the preferred embodiment of this aspect, because the pressing member for pressing the electrical part is not configured to provide the rotation-type unit but to provide the slide-type unit for sliding the press member along the slide member, some kind of force directed upward from the IC package is borne to the obliquely arranged slide member of the slide-type unit so that it is possible to ensure force sufficient to hold the electrical part. Moreover, because the press member is moved in the horizontal direction, it is possible to make short the moving distance of the press member. As a result, it is unnecessary to use the rotation arm having large length and to ensure the rotation area of the rotation arm, making it possible to make compact the size of the whole socket.

In addition, when only holding the electrical part, the slide member may be arranged in a horizontal direction.

However, in the preferred embodiment, because there is the possibility that the electrical part is warped, the slide member is arranged obliquely to make the press member move obliquely along the slide member so that, even if the electrical part is warped, it is possible to surely hold the electrical part.

In another preferred embodiment of the present invention, the electrical part has a rectangular shape, the peripheral portion is at least one side surface portion of the electrical part and the pressing means comprises a latch member arranged at a position of the socket body and adapted to press a position of the electrical part corresponding to the one side surface portion of the electrical part, the pressed position of the electrical part being located at a predetermined distance away from the one side surface portion thereof toward an other side surface portion opposite to the one side surface portion.

According to the preferred embodiment of this aspect, because the at least one side surface portion of the electrical part, which is the peripheral portion, is pressed by the pressing member, and a position of the electrical part which is located at the predetermined distance away from the one side surface portion thereof towards the other side surface is pressed by the latch member, it is possible to securely press both the center portion and the peripheral portion of the electrical part which is warped.

In another preferred embodiment of the present invention, the second contact pin is formed to be elastically deformable and with a contact portion, the second contact pin being operatively connected to the operation member, and the contact portion of the second contact pin is elastically deformed to separate from the second terminal when the operation member is moved downward, and when the operation member is moved upward, is returned by an elastic force thereof to contact to the second terminal.

In still another preferred embodiment of this aspect, the first terminal is formed at a bottom side thereof with one end portion which projects. from the bottom surface of the electrical part, and the first contact pin is adapted to contact to a side portion of the projecting one end portion of the first terminal.

Other objects and aspects of the present invention will become apparent from the following description of embodiments with reference to the following accompanying drawings.

DESCRIPTION OF THE PREFERRED EMBODIMENT

Figure 1:
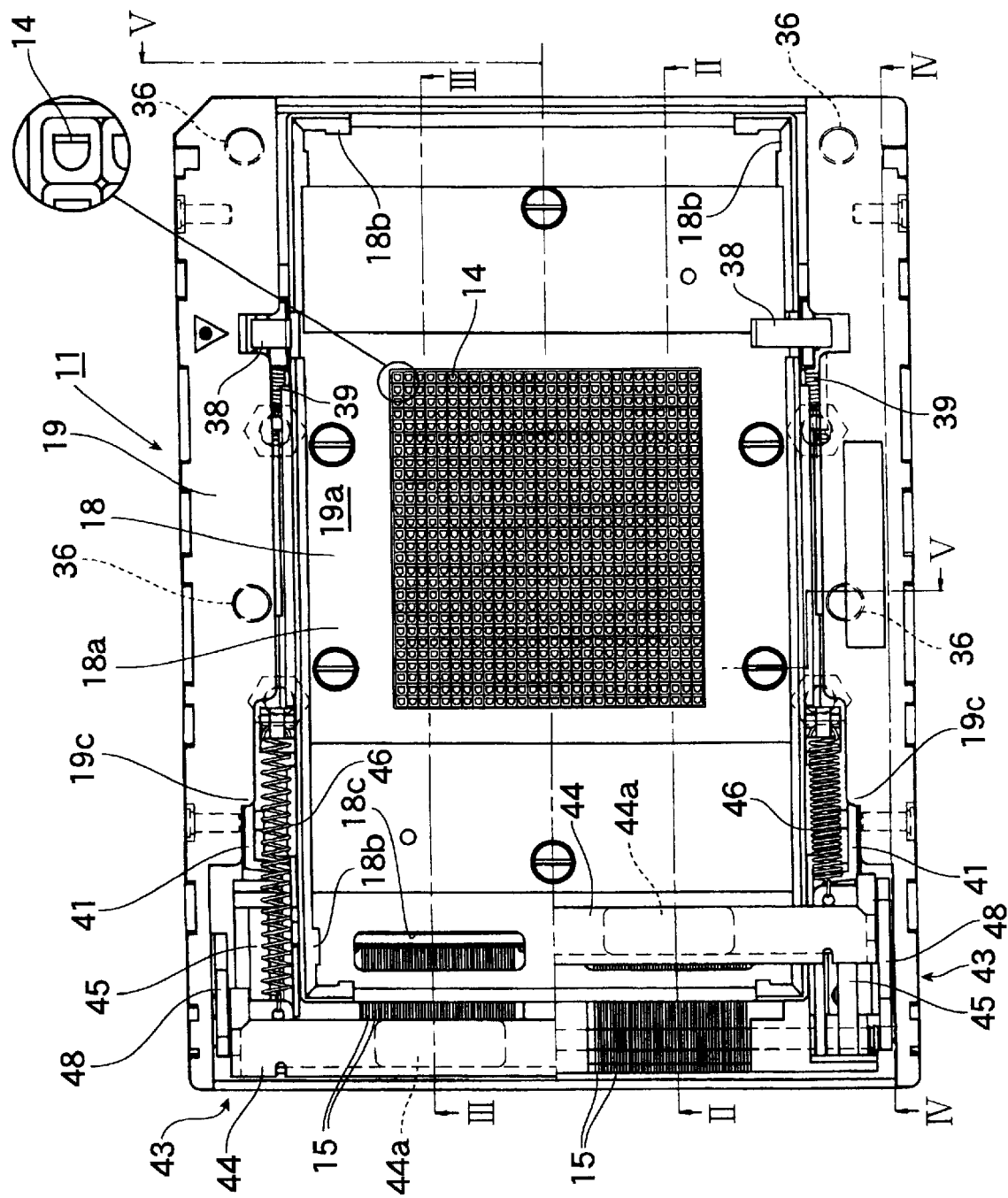
FIG. 1 is a top plan view of an IC socket according to an embodiment of the present invention.

The preferred embodiment of the present invention will be more precisely described hereinafter by referring to the accompanying drawings.

FIG. 1 to FIG. 16D show an embodiment of the present invention.

Referring first to a configuration of an IC socket according to the embodiment, reference numeral 11 in the drawings represents an IC socket as "socket for electrical parts". For carrying out a performance test of an IC package as "the electrical part", the IC socket 11 is operative to electrically connect the IC package 12 to a printed circuit board (not shown) of a tester.

This IC package 12, as shown in FIGS. 16A, 16B, 16C, 16D and so on, is a composite IC package which has a PGA (Pin Grid Array) connection portion and a LGA (Land Grid Array) connection portion. That is, the composite IC package 12 is provided with a comparatively large-sized package body 12a having, for example, a substantially rectangular shape, a longitudinal side of which has a length of approximately 90 mm.

The package body 12a has a center portion with a bottom surface on which a plurality of pin terminals, as center side terminals, are mounted so as to project downward therefrom. The pin terminals are arranged to be shaped as a matrix (grid array). The matrix shaped pin terminals constitute the PGA connection portion.

The package body 12a also has each side edge portion of the longitudinal direction thereof, which is along a lateral direction thereof, and one side edge portion of the package body 12a, as a peripheral portion, is formed with a land (metalized portion). The land has a bottom surface on which a plurality of plate terminals 12c, as peripheral side terminals, are mounted to be arranged in a row along the lateral direction of the package body 12a.

Incidentally, "bottom surface of the center portion of the package body 12a" means that bottom surface of the package body 12a except for the peripheral portion so that the center portion of the package body 12a is not limited to only a center portion and its near portion thereof.

On the other hand, the IC socket 11 is provided with a socket body 13 to be mounted on the printed circuit board. The IC socket 11 is also provided with center side contact pins 14 mounted on a center side of the socket body 13 and permitted to contact to the pin terminals 12b, and peripheral side contact pins mounted on one peripheral side of the socket body 13 and permitted to contact to the plate terminals 12c.

Moreover, the IC socket 11 has a slide plate 17 for elastically deforming the center side contact pins 14 and a top plate 18 on which the IC package 12 is mounted. The slide plate 17 and the top plate 18 are arranged to an upper side of the socket body 13 so as to be successively laminated toward an upward direction thereof.

Furthermore, on upper side of the top plate 18, an operation member 19 is arranged to be vertically movable and adapted to make the slide plate 17 slide in a horizontal direction.

Figure 9:
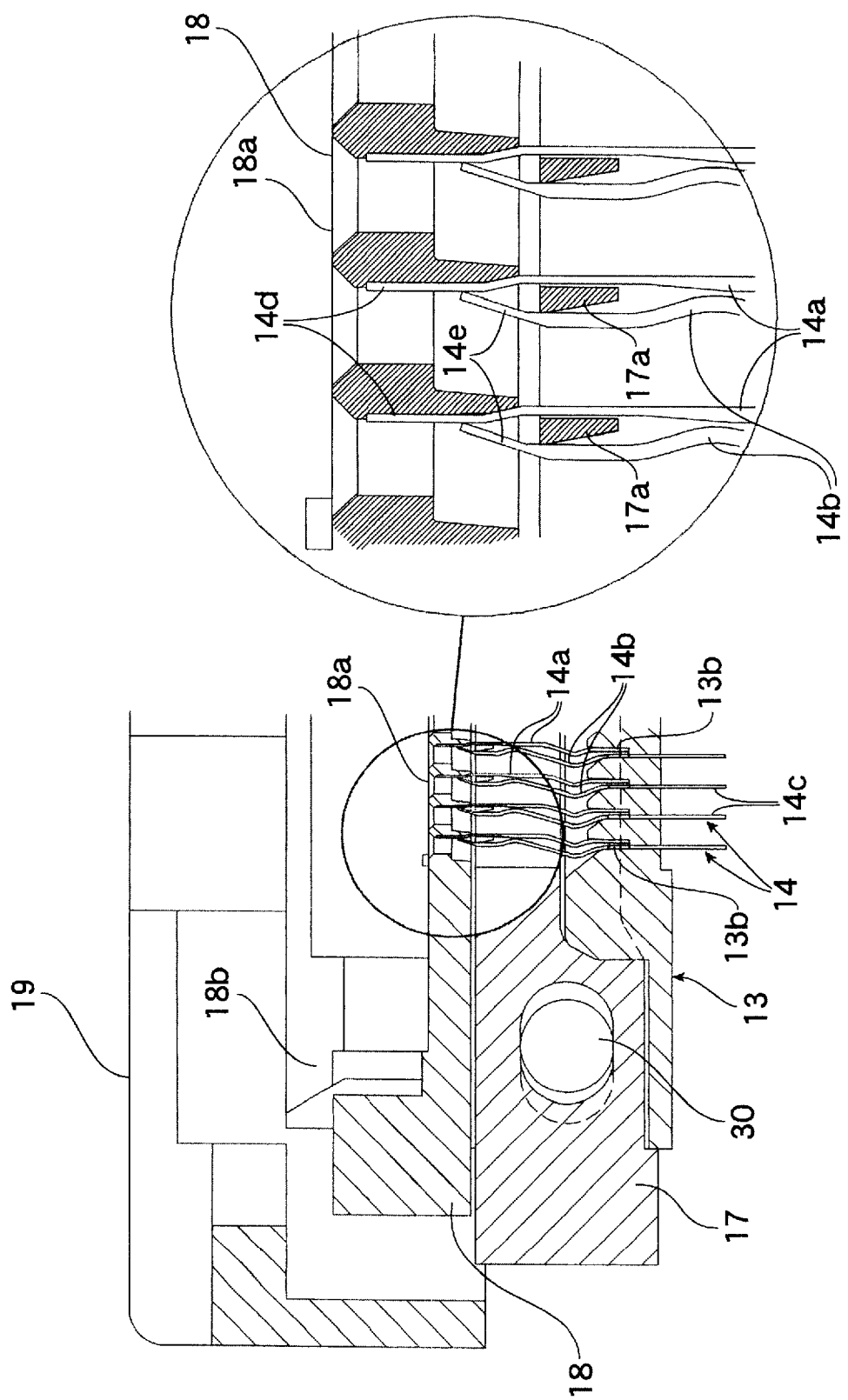
FIG. 9 is an enlarged sectional view showing a state that center side contact pins are closed according to the embodiment.

The center side contact pin 14 has elasticity and is formed in such a manner that a plate member having a superior conductivity is pressed by a press process so as to be formed as a shape shown in FIG. 9 and the like.

To explain it in detail, the center side contact pin 14 is formed at its upper end side with a stationary side elastic piece (referred simply to stationary elastic piece) 14a and a movable side elastic piece (referred simply to movable elastic piece) 14b for clamping the pin terminal 12b, and at its lower end side with one integrated lead portion 14c which can be electrically connected to the printed circuit board.

The paired elastic pieces 14a and 14b are formed at these upper end portions (tip end portions) with contact portions 14d and 14e, respectively, and these contact portions 14d and 14e can contact to a side peripheral portion of the pin terminal 12b and separate therefrom so that the pin terminal 12b is to be clamped by the paired contact portions 14d and 14e of the paired elastic pieces 14a and 14b. The contact portion 14d is to be extended upward in an axial direction thereof as compared with the contact portion 14e.

On the other hand, press-fit holes 13b are formed through the socket body 13 and through holes are formed through the printed circuit board (not shown).

Each of the center side contact pins 14 is pressed to fit in each of the press-fit holes 13b so that each of the lead portions 14c of each of the contact pins 14 projects downward from each of the press-fit holes 13b. Each of the projecting lead portions 14c is furthermore inserted through each of the through holes of the printed circuit board so that each of the end portions of each of the lead portions 14c which projects from each of the through holes is soldered to be electrically connected to the printed circuit board.

Figure 2:
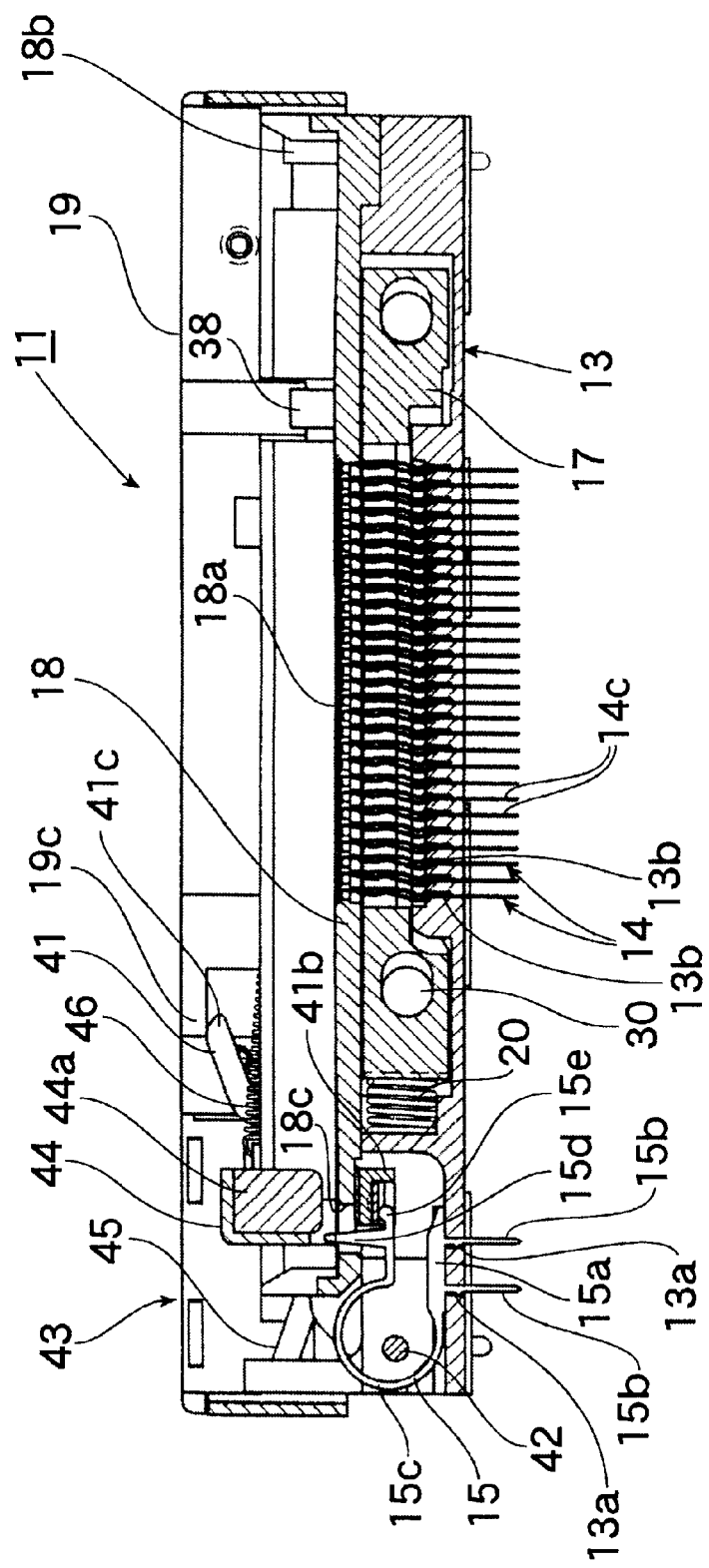
FIG. 2 is a sectional view taken along a line II—II of FIG. 1 according to the embodiment.
Figure 3:
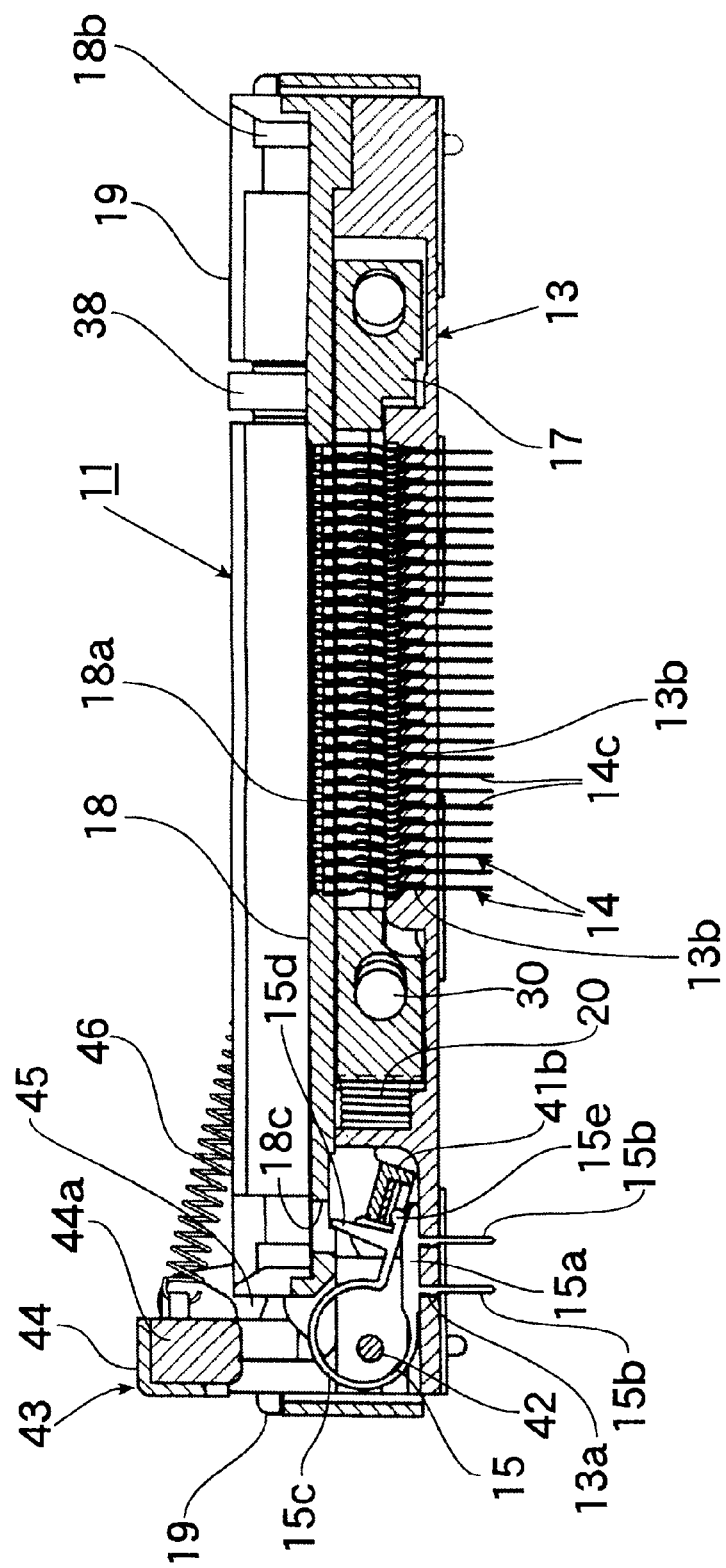
FIG. 3 is a sectional view taken along a line III—III of FIG. 1 according to the embodiment.

On the other hand, the slide plate 17 is arranged to be slidable in a right and left direction (a horizontal direction) in FIG. 2. When the slide plate 17 is slid, the movable elastic piece 14b of the center side contact pin 14 is elastically deformed to be displaced.

Figure 4:
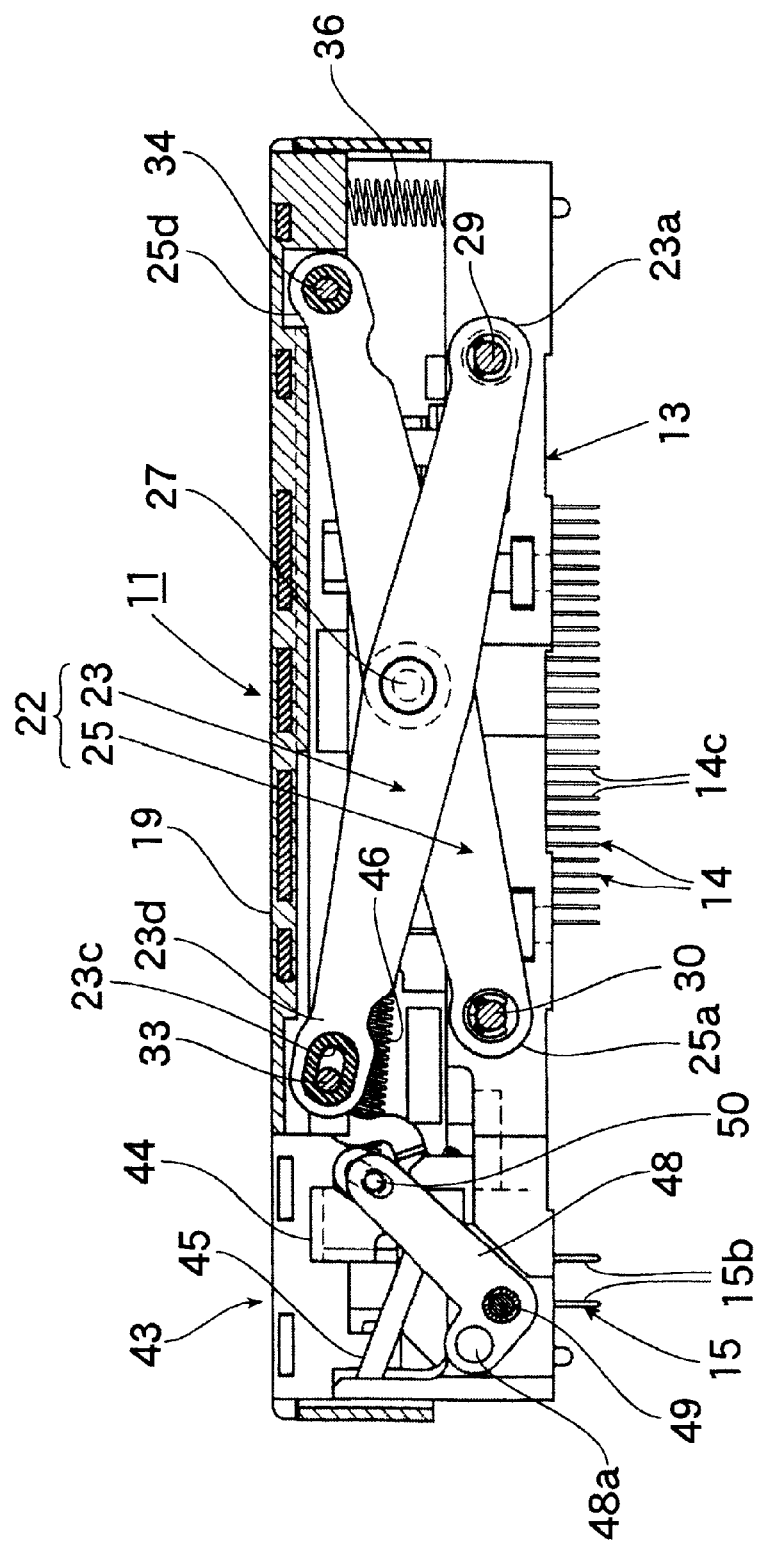
FIG. 4 is a sectional view taken along a line IV—IV of FIG. 1 according to the embodiment.
Figure 7:
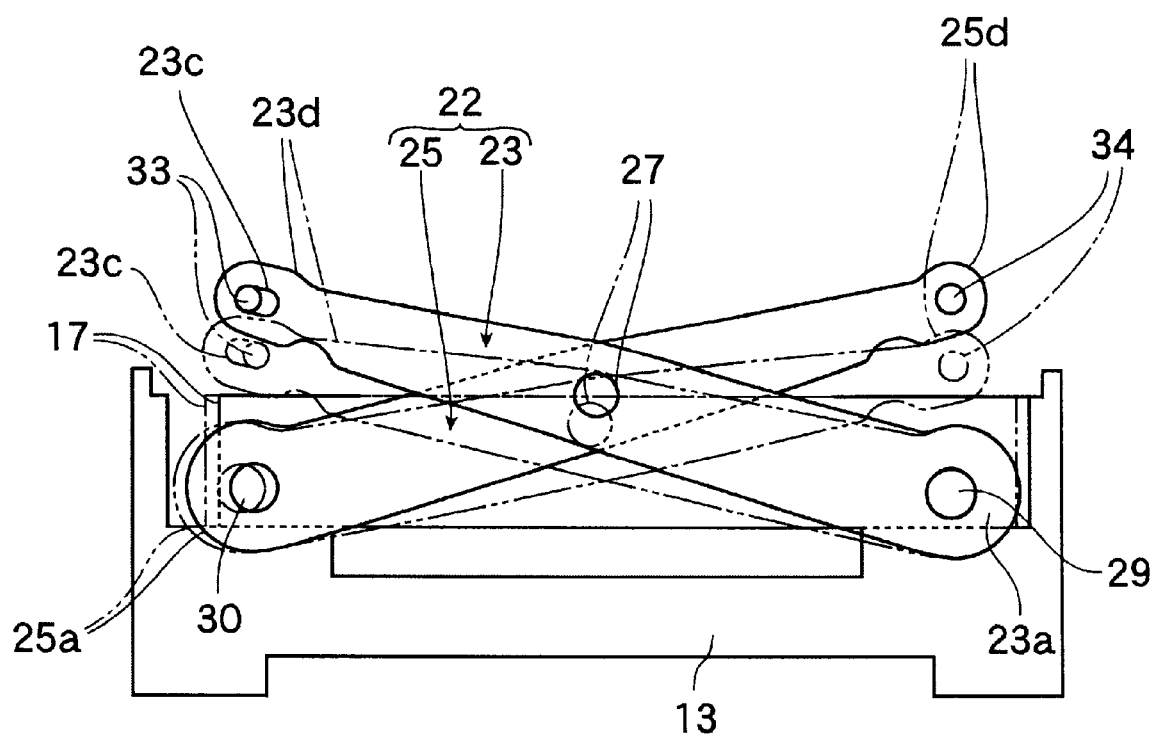
FIG. 7 is an explanation view showing an operation of an X-shaped link according to the embodiment.

The slide plate 17 is mechanically connected through X-shaped links 22 shown in FIGS. 4 and 7 to the operation member 19 so that, when the operation member 19 is moved vertically, the slide plate 17 is slid in the horizontal direction by operations of the X-shaped links 22. The slide plate 17 is provided with a press portion 17a adapted to press the movable elastic piece 14b so as to elastically deform the movable elastic piece 14b. Moreover, the slide plate 17 is elastically biased by a spring 20 toward the right direction in FIG. 2.

The X-shaped link 22 is disposed in correspondence with both side surface portions of the rectangular slide plate 17 in the slide direction so as to have toggle joint structure.

To explain it concretely, the X-shaped link 22, as shown in FIGS. 4 and 7, is provided with a first link member 23 and a second link member 25 each having a same length. The first link member 23 and the second link member 25 are rotatably joined by a center joint pin 27.

The first link member 23 has a lower end portion 23a and the lower end portion 23a is pivotally joined to the socket body 13 by a lower end joint pin 29. The second link member 25 has a lower end portion 25a and the lower end portion 25a is rotatably joined by a lower end joint pin 30 to one end portion of one of the side surface portions of the slide plate 17 in the slide direction thereof.

Upper end portions 23b and 25b of the first and second link members 23 and 25 are joined to the operation member 19 by upper joint pins 33 and 34, respectively. The first link member 23 is formed at its upper end portion 23b with a slot 23c so that the first link member 23 is joined through the slot 23c to the operation member 17 by the upper joint pin 33.

The top plate 18 is provided with a mount surface portion 18a on which the IC package 12 is mounted. The top plate 18 is also provided with guide portions 18b for arranging the IC package 12 to a predetermined position on the mount surface portion 18a. As shown in FIG. 1, the guide portions 18b are disposed on the mount surface portion 18a in correspondence with corner portions of the package body 12a, respectively.

The operation member 19, as shown in FIG. 1 and so on, is provided with an opening 19a having a predetermined area which allows the IC package 12 to be inserted therein. The IC package 12 is inserted through the opening 19a to be mounted on the mount surface 18a, so that the IC package 12 is located at the predetermined position defined by the guide portions 18b.

Figure 5:
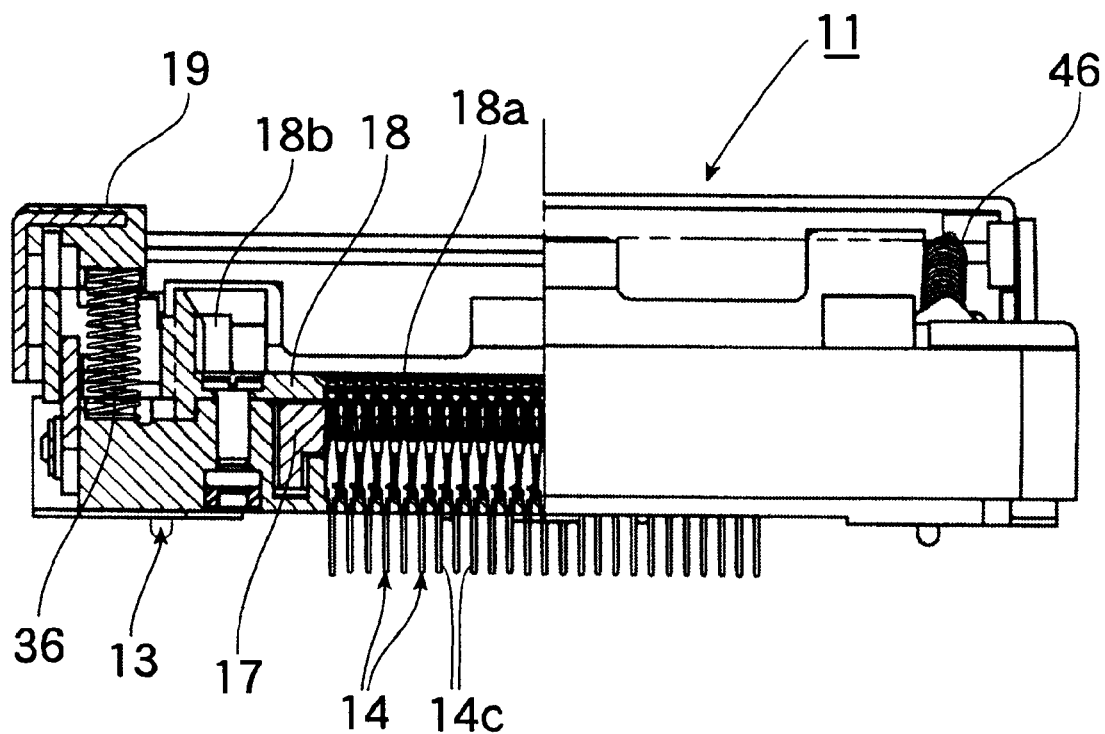
FIG. 5 is a sectional view taken along a line V—V of FIG. 1 according to the embodiment.
Figure 6:
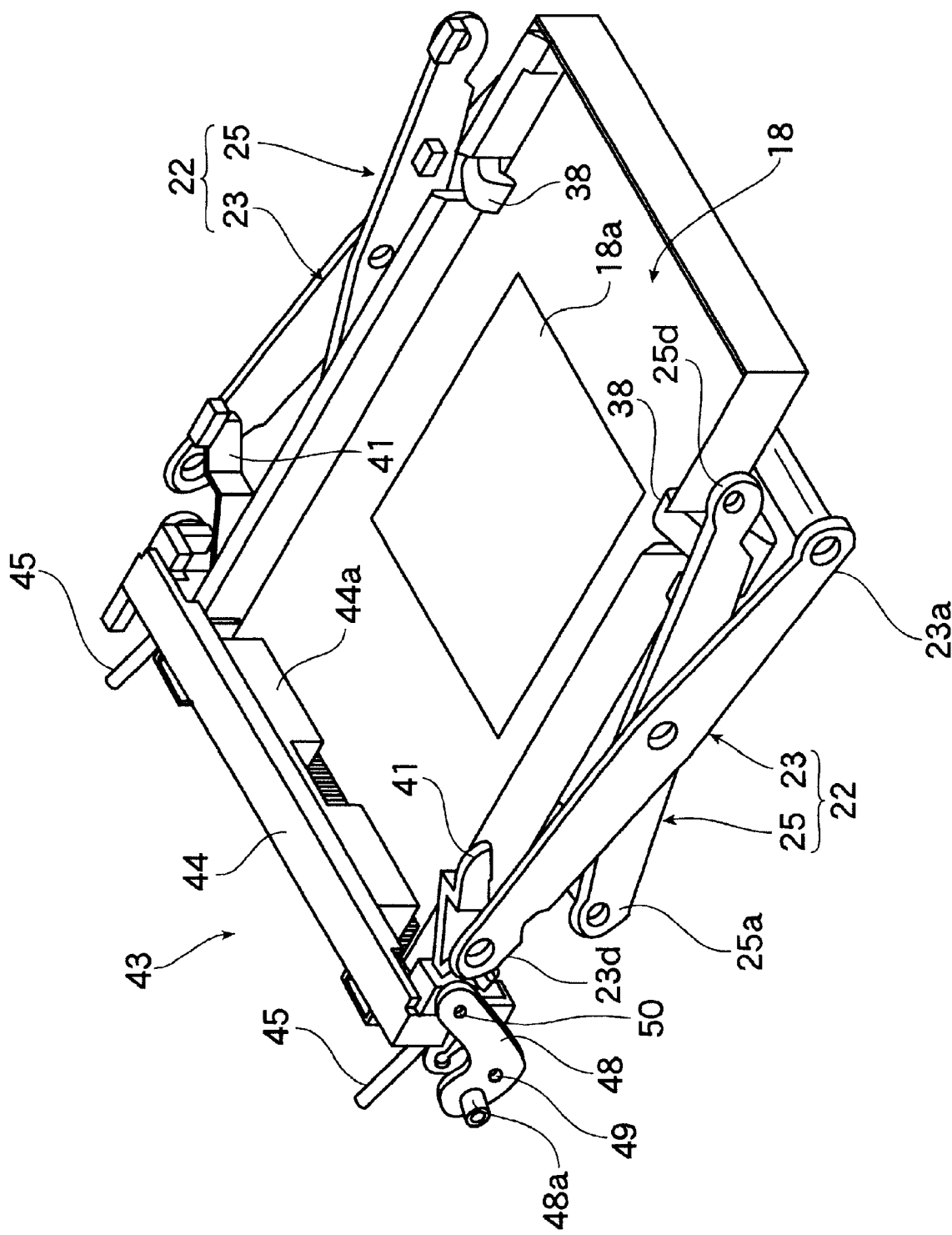
FIG. 6 is a perspective view showing a configuration of a substantial part of the IC socket according to the embodiment.

The operation member 19, as shown in FIGS. 4 and 5, is arranged to be movable vertically with respect to the socket body 13, and is urged upward by springs 36. The operation member 19 is also formed with a pair of operative protrusion portions 19b for rotating a pair of latch members 38.

Figure 8A:
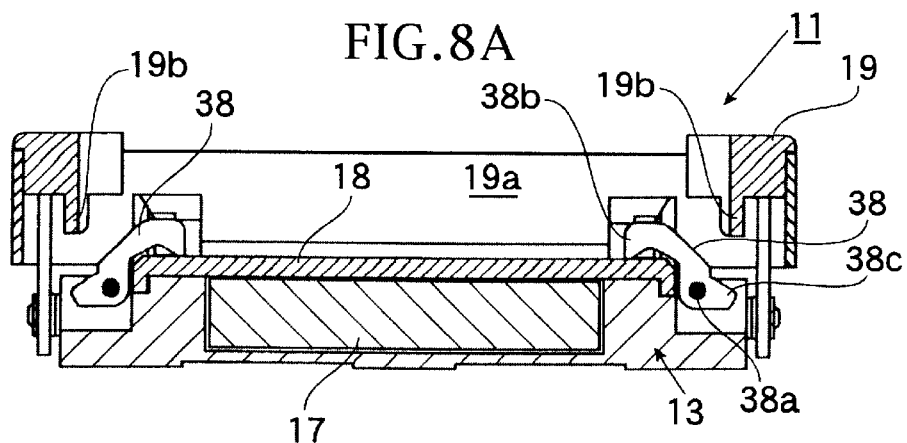
FIG. 8A is a sectional view showing operations of a latch member and so on in a state that the operation member is located at the upper limit position t o which the operation member can rise according to the embodiment.
Figure 8B:
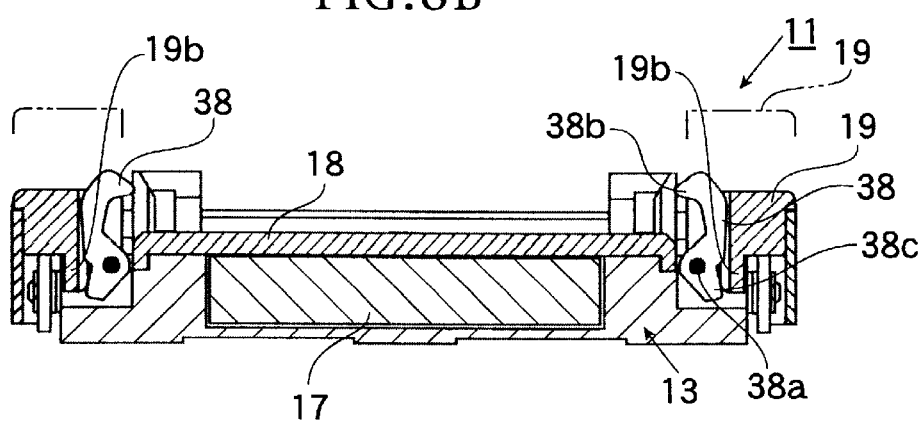
FIG. 8B is a sectional view showing operations of a latch member and so on in a state that the operation member is located at the lower limit position to which the operation member can move downward according to the embodiment.
Figure 8C:
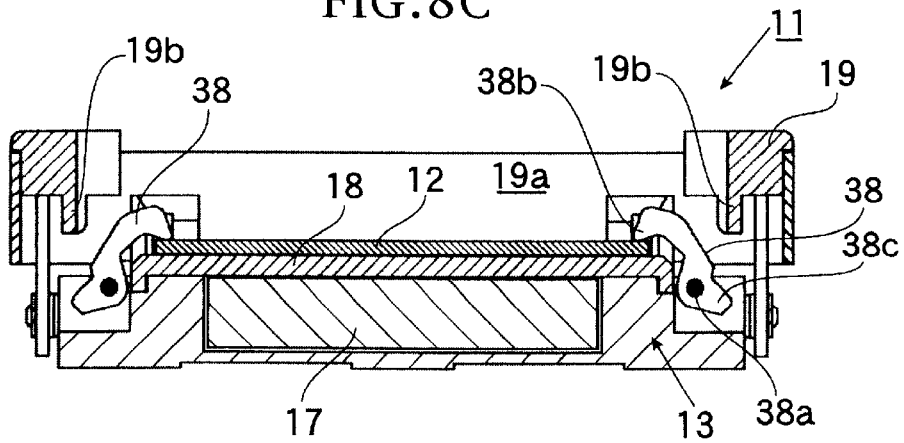
FIG. 8C is a sectional view showing operations of a latch member and so on in a state that the IC package is latched to be held by the latch member according to the embodiment.

As shown in FIGS. 8A, 8B, 8C and so on, each of the latch members 38 is disposed through a shaft 38a to the socket body 13 so as to rotate about the shaft 38a. The latch members 38 are urged by springs 39 toward the center side of the socket body 13, that is, close directions, respectively.

Each of the latch members 38 is provided with a press portion 38b for pressing, according to the urging force by each of the springs 39, a peripheral portion side of the IC package 12 mounted at the predetermined position on the mount surface 18a.

The position to be pressed by the press portion 38b of the peripheral portion side of the IC package 12 is set to the position which is located at a predetermined distance away from one side edge portion of the package body 12a, to which the plate terminals 12c are mounted, toward the other side edge portion opposite to the one side edge portion thereof.

In addition, each of the latch members 38 is also formed with a press portion 38c to be pressed by the protrusion portion 19b of the operation member 19.

When the operation member 19 is moved downward against the urging force of the springs 36, the press portion 38c of each of the latch members 38 is pressed by the protrusion portion 19b so that, as shown in FIG. 8B, the latch members 38 are rotated toward outward directions from the socket body 13, that is open directions opposite to the close directions against the urging forces of the springs 39, whereby the press portion 38b of each of the latch members 38 is withdrawn from an arrangement position of the IC package 12 above the mount surface portion 18a to a predetermined withdrawal position at which the mount of the IC package 12 to the top plate 19 is not interfered.

On the other hand, the peripheral side contact pin 15 contacting to the plate terminal 12c of the IC package 12 has elasticity and is formed in such a manner that a plate member having a superior conductivity is pressed by a press process.

The peripheral side contact pin 15, as shown in FIG. 2, is formed at its one end side (socket body side) with a stationary portion 15a which is pressed to be fit in the socket body 13, and lead portions 15b extending downwardly from the stationary portion 15a.

The peripheral side contact pin 15 is formed at an upper side of the stationary portion 15a with a spring portion 15c to be elastically deformable. The peripheral side contact pin 15 is also formed at the upper side of the stationary portion 15a with a contact portion 15d through the spring portion 15c, which projects to be in contact to the plate terminal 12c.

In addition, the IC socket 11 also has a lever member 41 for elastically deforming the peripheral side contact pins 15 to separate the contact portions 15d of the peripheral side contact pins 15 from the plate terminals 12c.

Figure 15A:
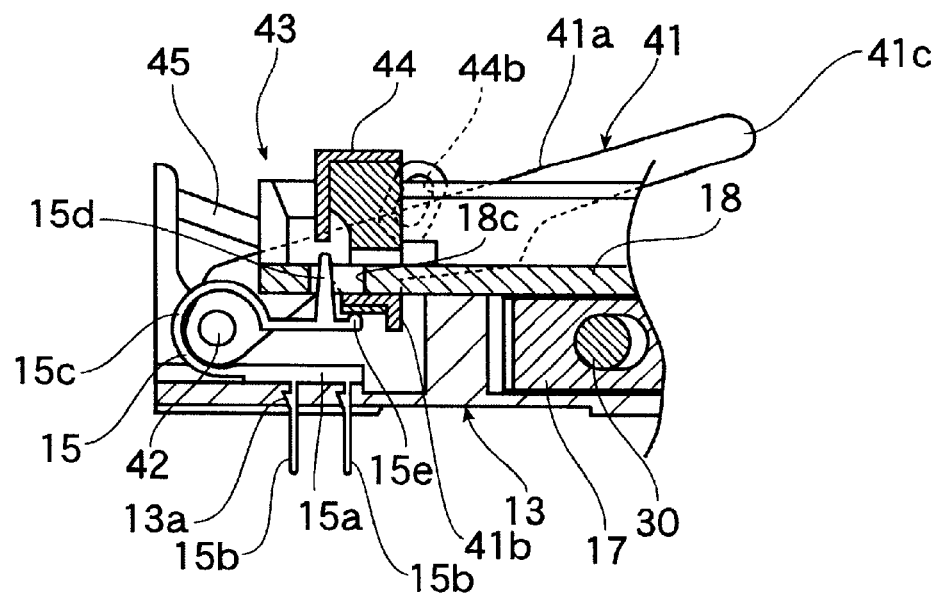
FIG. 15A is a view showing operations of a lever member, the contact pins, the press member and so on in a state that the operation member is located at the upper limit position according to the embodiment.
Figure 15B:
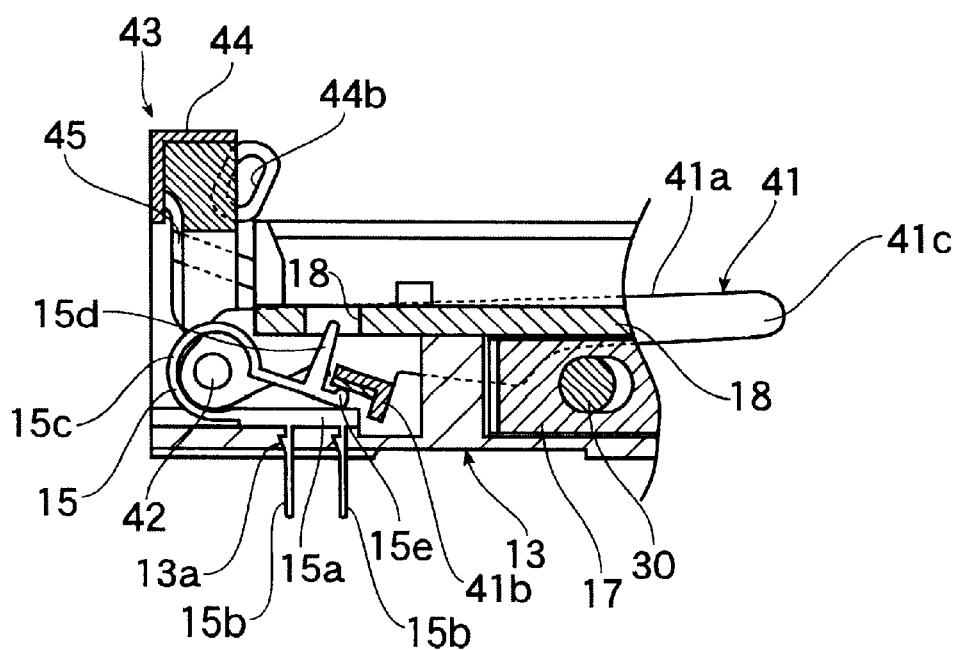
FIG. 15B is a sectional view showing operations of the lever member, the contact pins, the press member and so on in a state that the operation member is located at the lower limit position according to the embodiment.
Figure 16A:
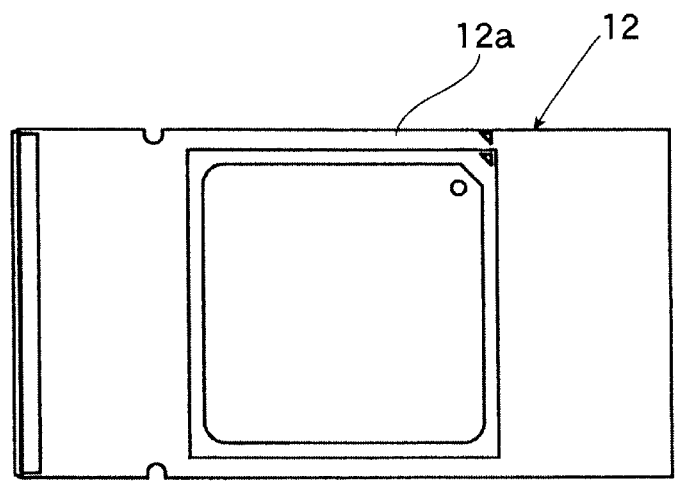
FIG. 16A is a top plan view showing the IC package according to the embodiment.
Figure 16B:
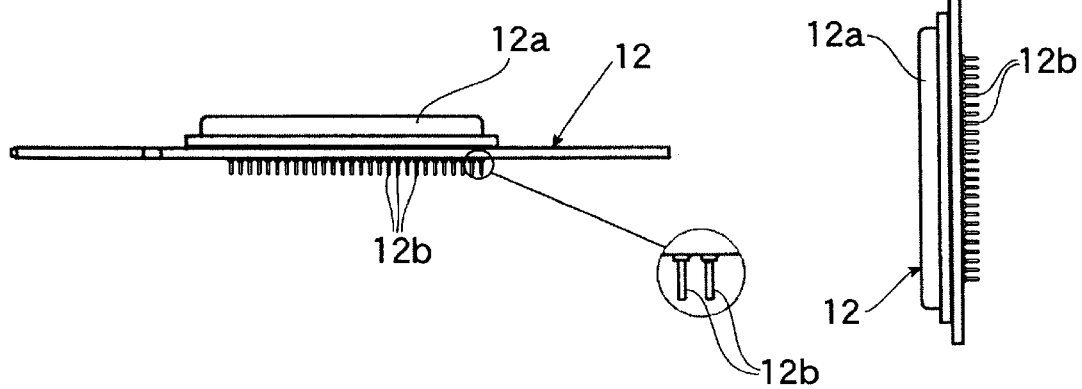
FIG. 16B is a front view showing the IC package shown in FIG. 16A according to the embodiment.
Figure 16C:
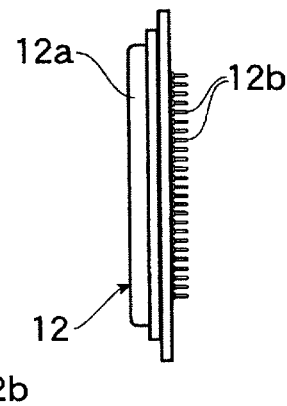
FIG. 16C is a right side view showing the IC package shown in FIG. 16A according to the embodiment.
Figure 16D:
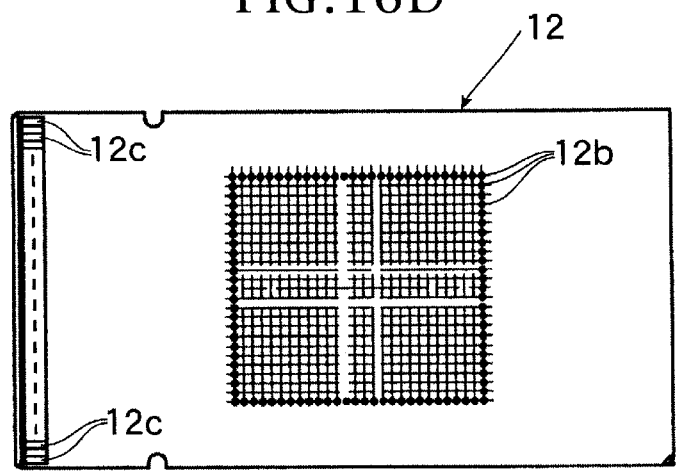
FIG. 16D is a bottom view showing the IC package shown in FIG. 16A according to the embodiment.

The lever member 41, as shown in FIG. 1, FIG. 15A and 15B, is provided with a pair of arm portions 41a so that the arm portion 41a is arranged on both sides of the socket body 13. The paired arm portions 41a are linked by a bridge portion 41b so as to rotate about a shaft 42.

One end portion 41c of each arm portion 41a is to be pressed by each press portion 19c of the operation member 19 so that, when the operation member 19 is moved downward, as shown in FIG. 15B, other end portions 15e of the peripheral side contact pins 15 are pressed by the bridge portion 41b so that the peripheral side contact pins 15 are elastically deformed, thereby moving the contact portions 15d downward.

In addition, the IC socket 11 is provided with a pair of peripheral portion press units 43 for pressing downward an upper surface 12d of the peripheral portion (the one side edge portion) on which the plate terminals 12c are mounted.

The pair of press units 43 is provided with a pair of press members 44 for pressing the upper surface 12d of the peripheral portion and a pair of rod-like slide members 45 which is obliquely arranged to the socket body 13 from an oblique upper side with respect to the peripheral portion of the top plate 18 to a vicinity of the top plate 18 so that the press member 44 is obliquely slidable along the slide member 45.

The press member 44 is formed to have a length corresponding to a full length of the upper surface 12d of the peripheral portion, and formed with a press pad 44a for pressing the upper surface 12d of the peripheral portion. The press member 44 is urged obliquely downward along the slide member 45 by a tension spring 46.

Figure 13:
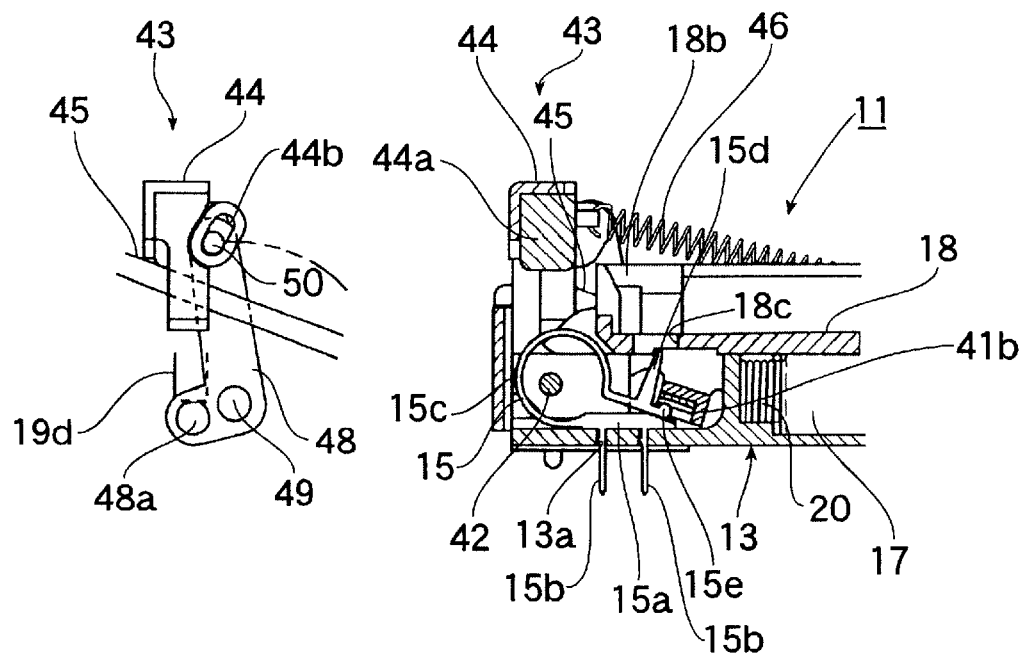
FIG. 13 is a view showing the press member, the peripheral side contact pins and so on in a state that the operation member is located at the lower limit position to which the operation member can move downward according to the embodiment.

Moreover, as shown in FIG. 13, the pair of press units 43 has a pair of link members 48 so that each link member 48 is arranged on each side of the socket body 13. The paired link members 48 are mechanically joined to the operation member 19 and the pair of press members 44. That is, the link member 43, when the operation member 19 is moved downward, operates to move the press member 44 obliquely upward along the slide member 45 so that the press member 44 is withdrawn from an insertion area of the IC package 12 over the top plate 18.

Figure 12:
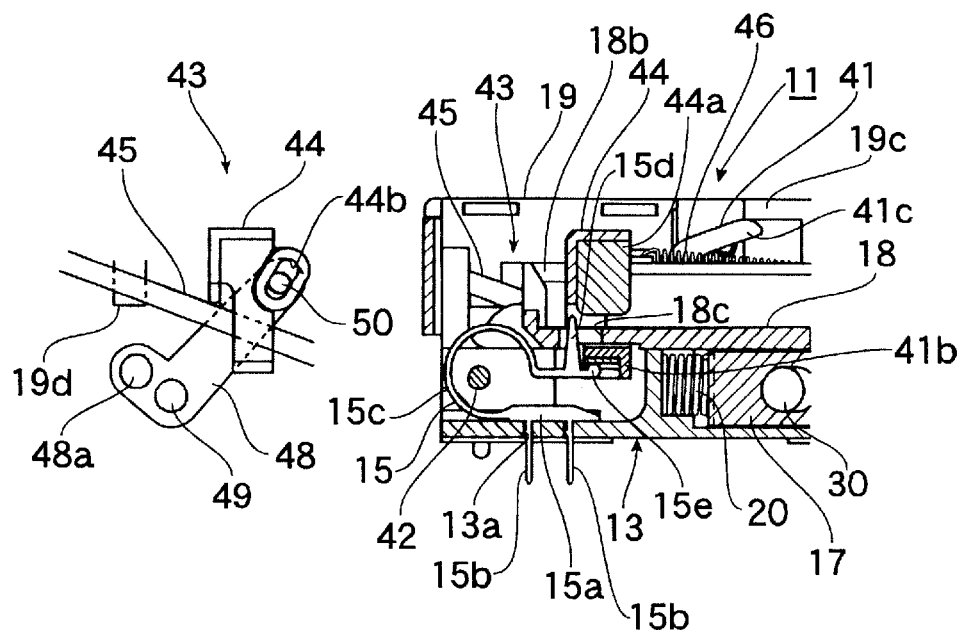
FIG. 12 is a view showing a press member, peripheral side contact pins and so on in a state that the operation member is located at the upper limit position to which the operation member can rise according to the embodiment.

The link member 48, as shown in FIG. 4 and FIG. 12, substantially has an L-shape, and is rotatably joined to the socket body 13 by a shaft 49 disposed to a bent portion of the L-shaped link member 48. The link member 48 is also provided at its upper end portion with a press pin 50 which is inserted in a slot 44b of the press member 44.

Furthermore, the link member 48 has a pressed shaft 48a adapted to be pressed by a push portion 19d of the operation member 19 so that the link member 48 is rotated in a counter-clockwise direction in FIG. 12, whereby the press member 44 is moved obliquely upward along the slide member 45 so that the press member 44 is withdrawn from the insertion area of the IC package 12 over the top plate 18.

Next, operations of the IC socket 11 of the embodiment will now be explained hereinafter.

Figure 10:
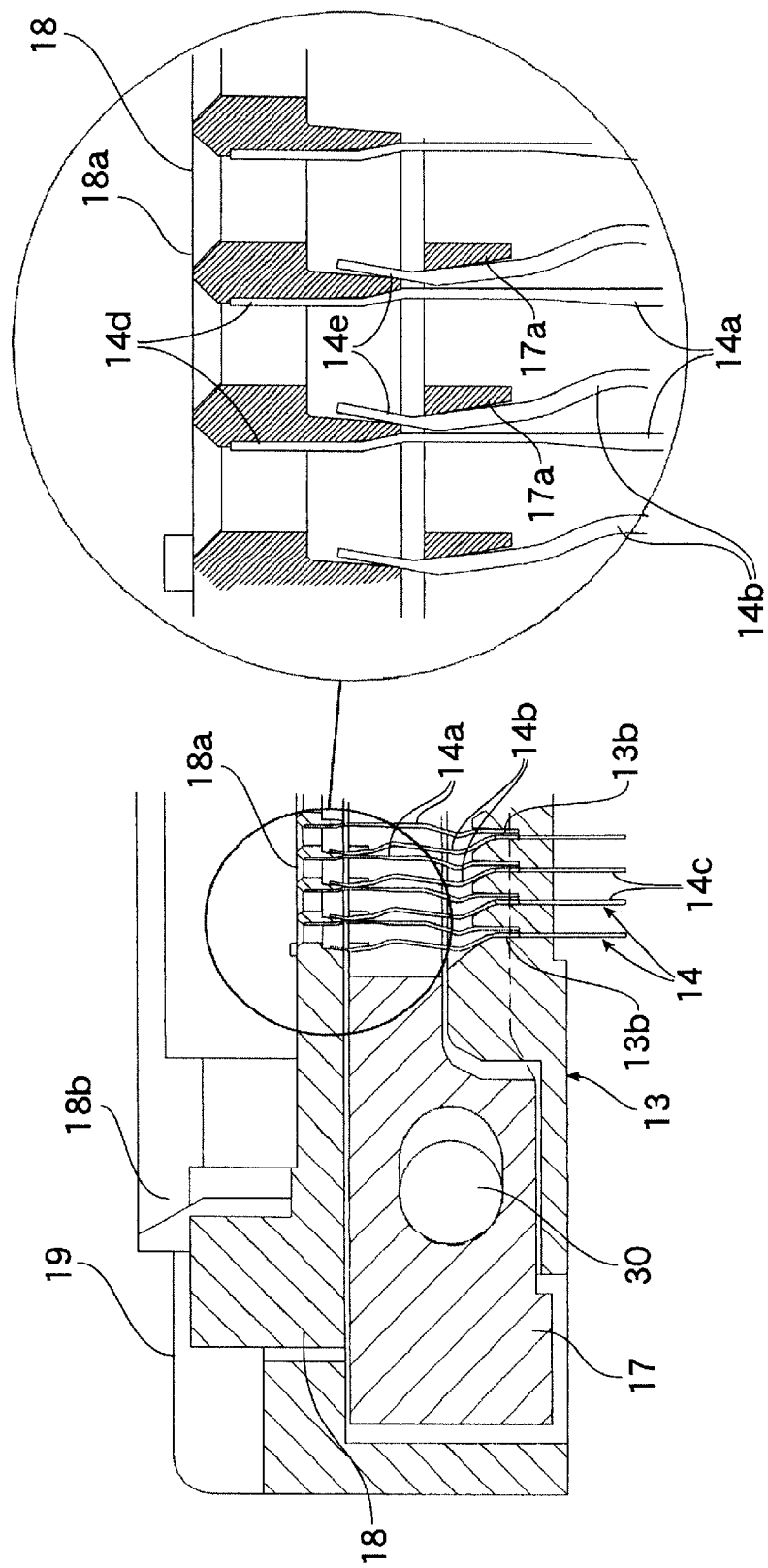
FIG. 10 is an enlarged sectional view showing a state that the center side contact pins are opened according to the embodiment.

When the IC package 12 is set to the IC socket 11 arranged on the printed circuit board, the operation member 19 of the IC socket 11 is pressed downward. The downward movement of the operation member 19 makes the slide plate 17 slide in the left direction, which is shown as a chain double-dashed line in FIG. 7 so that, as shown in FIG. 10, by the press portion 17a of the slide plate 17, the movable elastic piece 14b is pressed to be elastically deformed, and, as a result, the state of the movable elastic piece 14b shown in FIG. 9 is changed to the state thereof shown in FIG. 10.

The deform of the movable elastic piece 14b makes open the pair of the contact portions 14d and 14e of the contact pin 14 so that a gap between these contact portions 14d and 14e is formed, into which the pin terminal 12b is permitted to be inserted.

Simultaneously with the above operations, the end portion 41c of the lever member 41 is pressed downward by the press portion 19c of the operation member 19 so that the latch member 41 rotates. According to the rotation of the latch member 41, the end portion 15e of the peripheral side contact pin 15 is pressed downward by the bridge portion 15b of the rotating lever member 41 so that the contact portion 15d is displaced downward from a position shown in FIG. 12 to a position shown in FIG. 13.

After the down movement of the contact portion 15d, when the operation member 19 is further moved downward to a predetermined position (height), the push portion 19d of the operation member 19 contacts to the pressed shaft 48a of the link member 48. At this moment, the contact portion 15d is withdrawn from the position at which the contact portion 15d operation member 19 is still further moved downward from the state that the contact portion 15d is withdrawn, the push portion 19d presses the pressed shaft 48a of the link member 48, whereby the link member 48 is rotated in the counter-clockwise direction.

The rotation of the link member 48 makes the press pin 50 move obliquely upward along the slide member 45 against the urging force by the tension spring 46, with the press pin 50 being slide in the slot 44b of the press member 44. When the operation member 19 is reached to the lower limit position, the press member 44 is withdrawn from the insertion area of the IC package 12 over the top plate 18 as shown in FIG. 13.

When operating member 19 is lowered, a pressed portion 38c of the latch member 38 is pressed by an operative protrusion portions 19b of the operation member 19, thereby the latch member 38 is opened against the urging force of the spring 39 as shown in FIG. 8B. And when the operation member 19 is reached to its lower limit position, the latch member 38 withdraws from the insertion area of the IC Package 12 as shown in FIG. 8B.

In this state, the IC package 12 is mounted on the mount surface portion 18a of the top plate 18 so as to be guided by the guide portions 18b, thereby being set to the predetermined position on the mount surface portion 18a. Each of the pin terminal 12b is inserted into each of the gaps formed by each of the opened contact portions 14d and 14e of each of the center side contact pins 14 while each of the pin terminals 12b is in non-contact with each of the contact portions 14d and 14e.

After the insertion of each pin terminal 12b in each of the paired contact portions 14d and 14e, when downward press force applied to the operation member 19 is released, the operation member 19 moves upward by the urging force of the springs 36, so that the upward movement force of the operation member 19 is transferred through the X-shaped operation link 22 to the slide plate 17 and the urging force of the spring 20 acts on the slide plate 17, whereby the slide plate 17 is slid toward the right direction from a state of the slide plate 17 shown in FIG. 10.

Figure 11:
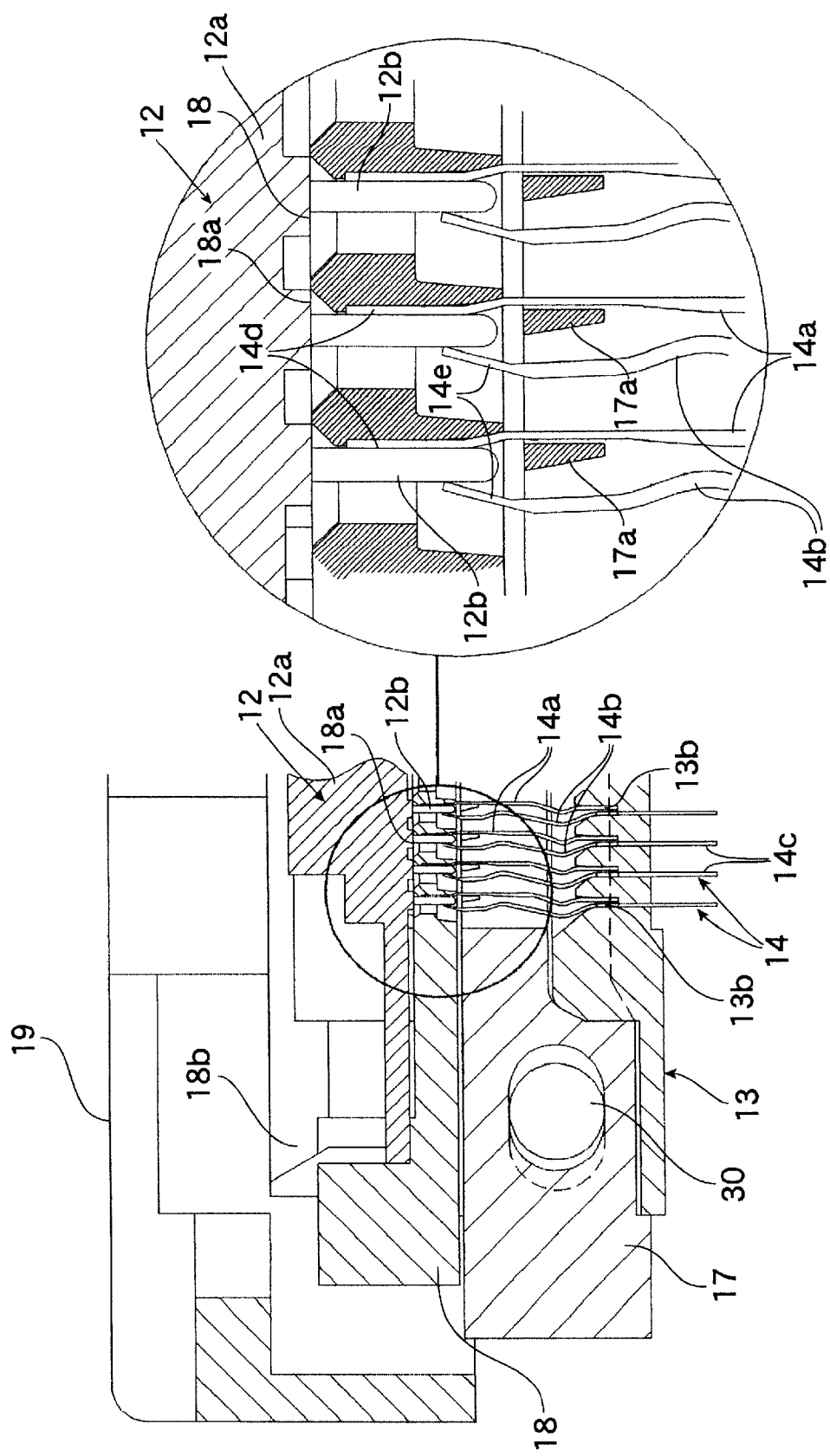
FIG. 11 is an enlarged sectional view showing a state that pin terminals are clamped by the center side contact pins according to the embodiment.

When the slide plate 17 is slid toward the right direction, press force applied to the movable elastic piece 14b of the center side contact pin 14 is released so that the movable elastic piece 14b is getting to return to the original position, thereby clamping the pin terminal 12b by the contact portion 14e of the movable side elastic piece 14b and the contact portion 14d of the stationary side elastic piece 14a, as shown in FIG. 11.

As a result, each pin terminal 12b of the IC package 12 and the printed circuit board is electrically connected through each center side contact pin 14.

On the other hand, in the peripheral side contact pin 15 side, when the operation member 19 is moved upward, the pressing force of the link member 48 with respect to the pressed shaft 48a is released so that the press member 44 is pulled by the tension spring 46, whereby the press member 44 moves obliquely downward along the slide member 45 toward the upper surface 12d of the peripheral portion of the IC package 12 on which the plate terminals 12c are mounted.

Figure 14:
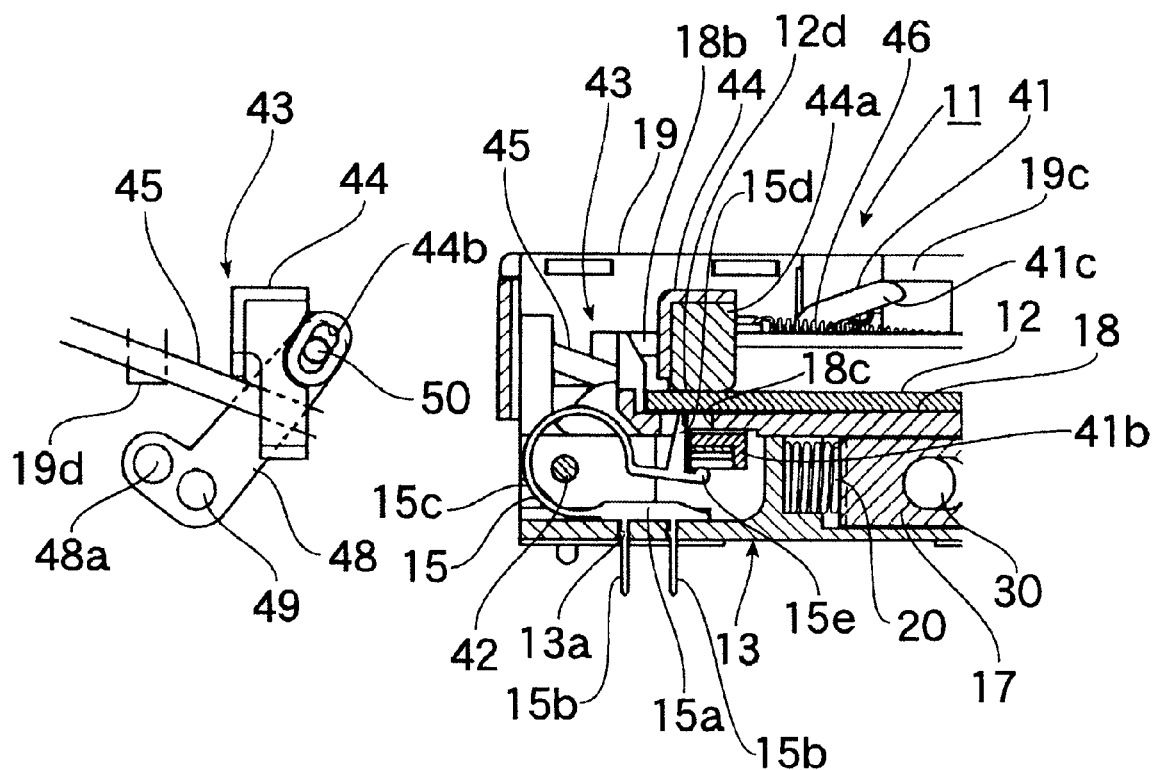
FIG. 14 is a view showing the press member, the contact pins and so on in a state that the IC package is set to the IC socket according to the embodiment.

As a result, the press pad 44a of the press member 44 contacts to the upper surface 12d of the peripheral portion of the IC package 12 so that, even if the IC package 12 is warped, it is possible to securely hold the IC package 12, as shown in FIG. 14.

On the other hand, when the operation member 19 is further moved upward, the pressing force to the lever member 41 is released so that the peripheral side contact pin 15 is returned to the original position by the elastic force of the spring portion 15c, whereby the contact portion 15d of the peripheral side contact pin 15 makes displacement upward.

Then, after the press pad 44a of the press member 44 contacts to the upper surface 12d of the peripheral portion of the IC package 12, the contact portion 15d of the peripheral side contact pin 15 contacts to the plate terminal 12c on the bottom surface of the peripheral portion of the IC package 12 so that the IC package 12 and the peripheral side contact pin 15 are electrically connected. That is, after the press pad 44a of the press member 44 holds the upper surface 12d of the peripheral portion of the IC package 12, the contacting timing of the contact portion 15d to the plate terminal 12c is set.

According to the structure of the IC socket 11, even if the IC package 12 is warped, it is possible to surely contact the contact portion 15d of the peripheral side contact pin 15 to the plate terminal 12c of the IC package 12 at a predetermined contact pressure, thereby securing the stability of contacting the peripheral side contact pin 15d to the plate terminal 12c of the IC package 12.

Moreover, because the peripheral portion press unit 43 is configured to a slide-type unit so that the press member 44 is slid obliquely downward along the slide member 45, as compared with a rotation-type unit for moving the press member, it is possible to ensure a pressing force to the IC package 12 by the press member 44, which is sufficient to press thereto, thereby making compact a mechanism for moving the press member 44.

That is, assuming that the rotation-type unit for moving the press member is applied to the IC socket 11, the rotation-type unit is configured to rotate a rotation arm having at its one end portion with a press member so as to press the IC package by the press member.

However, when rotating the rotation arm, if the IC package is subjected to some kind of force directed upward from the IC package, because the rotation arm is easy to be rotated due to the some kind of force, it is hard to efficiently secure a sufficient pressing force.

Then, it is considerable to enlarge the urging force of the spring which urges the rotation arm, but new problems such that operating force of the rotation arm is enlarged and the unit is made enlarged occur. In addition, because of using the rotation arm having a predetermined length, it is necessary to ensure a rotation area of the rotation arm, thereby causing the whole size of the IC socket to be large-sized.

On the contrary, in this embodiment, because the peripheral portion press unit 43 for moving the press member 44 is not configured to provide the rotation-type unit but to provide the slide-type unit for sliding the press member 44 along the slide member 45, some kind of force directed upward from the IC package is borne to the obliquely arranged slide member 45 of the slide-type unit 43 so that it is possible to ensure force sufficient to hold the IC package 12. Moreover, because the press member 44 is moved in the horizontal direction, it is possible to make short the moving distance of the press member 44. As a result, it is unnecessary to use the rotation arm having the large length and to ensure the rotation area of the rotation arm, thereby making compact the whole socket 11.

It is true that, when only holding the IC package 12, the slide member 45 may be arranged in the horizontal direction.

However, in the embodiment, because there is the possibility that the IC package 12 is warped, the slide member 45 is arranged obliquely to make the press member 44 move obliquely along the slide member 45 so that, even if the IC package 12 is warped, it is possible to surely hold the IC package 12.

Moreover, because the one side edge portion of the IC package 12 is held by the press member 44 and the portion located at a predetermined distance away from one side edge portion of the IC package 12 is held by the latch member 38, it is possible to keep the IC package 12 flat.

Incidentally, in the embodiment, the present invention is applied to the IC socket 11 as "socket for electrical parts" application.

That is, the present invention may be applied to a socket for electrical parts except for the IC package.

Moreover, in the embodiment, the pin terminal 12*b* as "center side terminal" and the plate terminal as "peripheral side terminal" are used, but the present invention is not limited to the structure.

That is, solder balls which are terminals in BGA (Ball Grid Array) type connection may be used as "center side terminal" and "peripheral side terminal".

Furthermore, the shape and the manner of the contact pin connecting to the terminal are not limited to the shape and the manner shown in the embodiment.

For example, the IC socket may be configured so that one side of the contact pin contacts to the pin terminal, or the contact pin contacts the terminal, such as solder ball, from the under side thereof.

In addition, the slide plate 17 is slid in the horizontal direction, but the slide plate 17 may be slid vertically to elastically deform the elastic piece of the contact pin.

Furthermore, in this embodiment, the slide member has substantially rod shape, but the present invention is not limited to the shape. That is, the slide member may have any shapes, such as rail shape with a groove.

While there has been described what is at present considered to be the preferred embodiments and modifications of the present invention, it will be understood that various modifications which are not described yet may be made therein, and it is intended to cover in the appended claims all such modifications as fall within the true spirit and scope of the invention.

What is claimed is:

1. A socket for an electrical part having a center portion, a peripheral portion, a first terminal mounted on the center portion and a second terminal mounted on the peripheral portion, said socket comprising:
    a socket body to accommodate the electrical part;
    a first contact pin arranged on the socket body and adapted to contact the first terminal of the electrical part;
    a second contact pin arranged on the socket body and adapted to contact the second terminal of the electrical part; and
    an operation member arranged on the socket body to be vertically movable; and
    pressing means for pressing an upper surface of the peripheral portion towards a bottom surface side thereof;
    wherein said pressing means comprises:
        a slide member obliquely arranged on the socket body from an oblique upper side with respect to a surface portion of the socket body to a vicinity of the surface portion, said electrical part being mounted on the surface portion of the socket body to be accommodated therein,
        a press member to slide along the slide member to press the upper surface of the peripheral portion, and
        a movement unit operatively connected to the operation member and the press member and to move the press member obliquely upward along the slide member when the operation member is moved downward,
    said movement unit being adapted to move the press member obliquely downward along the slide member when the operation member is moved upward so as to press, by the press member, the upper surface of the peripheral portion of the electrical part.

2. A socket according to claim 1, wherein said second contact pin is formed to be elastically deformable and provided with a contact portion, said second contact pin being operatively connected to the operation member, and wherein said contact portion of the second contact pin is elastically deformed to separate from the second terminal when the operation member is moved downward, and when the operation member is moved upward, the second contact pin is returned by an elastic force thereof to be contacted to the second terminal.

3. A socket according to claim 1, wherein said movement unit comprises:
    an urging member to urge the press member towards the surface portion of the socket body, and
    a link member rotatably provided for the socket body and operatively connected to the press member,
    wherein when the operation member is moved downward, said link member is pushed by the operation member is rotated so that the press member is moved obliquely upward along the slide member against an urging force of the urging member, and when the operation member is moved upward, a pushing force to the link member by the operation member is released so that the press member is moved obliquely downward along the slide member by the urging force of the urging member.

4. A socket according to claim 3, wherein said press member is moved obliquely upward so that the press member is withdrawn from an insertion area of the electrical part over the surface portion of the socket body.

5. A socket according to claim 1, wherein said first terminal is formed at a bottom side thereof with one end portion projecting from the bottom surface of the electrical part, and said first contact pin is adapted to contact a side portion of the projecting one end portion of the first terminal.

6. A socket according to claim 1, wherein said second terminal has a substantially plate shape.

7. A socket according to claim 1, wherein the slide member has a substantially rod shape or a rail shape with a groove.

8. A socket according to claim 1, wherein the pressing means comprises first and second pressing means, the first and second pressing means arranged on opposite sides of the socket body and having a pair of the press members being combined to be a single body and having a length corresponding to a full length of the upper surface of the peripheral portion.

9. A socket according to claim 8, wherein the pair of press members are formed with a press pad to press the upper surface of the peripheral portion.

10. A socket according to claim 1, wherein:

said electrical part has a rectangular shape, said peripheral portion comprises a first side surface portion of the electrical part, said pressing means is arranged at a position of the socket body corresponding to the first side surface portion of the electrical part, and adapted to press a position of the electrical part, said socket further comprising a latch member arranged on the socket body, to press the electrical part towards the bottom surface side, and a pressed position of the electrical part by the latch member being located at a predetermined distance from the first side surface portion towards a second side surface portion opposite to said first side surface portion.

11. A socket according to claim 10, wherein the latch member comprises first and second latch members, the first and second latch members positioned opposite to each other across the socket body.

12. A socket for an electrical part having a center portion, a peripheral portion, a first terminal mounted on the center portion and a second terminal mounted on the center portion and a second terminal mounted on the peripheral portion, said socket comprising:

a socket body to accommodate the electrical part;

a first contact pin arranged on the socket body and adapted to contact the first terminal of the electrical part;

a second contact pin arranged on the socket body and adapted to contact the second terminal of the electrical part;

an operation member arranged on the socket body to be vertically movable; and pressing means for pressing an upper surface of the peripheral portion towards a bottom surface side thereof;

wherein said pressing means comprises:

a press member provided to press the upper surface of the peripheral portion, and parallelistically shifting means to guide the press member, said press member being moved, in a parallel manner, along the parallelistically shifting means when the operation member is moved downward, so that the press member is withdrawn from an insertion area of the electrical part over a surface portion of the socket body, and said press member being moved, in the parallel manner, along the parallelistically shifting means when the operation member is moved upward, so that the press member presses the upper surface of the peripheral portion of the electrical part.

13. A socket according to claim 12, wherein the parallelistically shifting means comprises a slide member, the press member being moved along the slide member in cooperation with the operation member.

14. A socket according to claim 13, wherein the slide member is obliquely arranged with respect to the socket body from an oblique upper side with respect to the surface portion of the socket body to a vicinity of the surface portion thereof.

15. A socket for an electrical part having a peripheral portion, said socket comprising:

a socket body to accommodate the electrical part;

an operation member arranged on the socket body to be vertically movable; and pressing means for pressing an upper surface of the peripheral portion towards a bottom surface side thereof;

wherein said pressing means comprises:

a slide member obliquely arranged on the socket body from an oblique upper side with respect to a surface portion of the socket body to a vicinity of the surface portion, said electrical part being mounted on the surface portion of the socket body to be accommodated therein, a press member to slide along the slide member to press the upper surface of the peripheral portion, and a movement unit operatively connected to the operation member and the press member and to move the press member obliquely upward along the slide member when the operation member is moved downward, said movement unit being adapted to move the press member obliquely downward along the slide member when the operation member is moved upward so as to press, by the press member, the upper surface of the peripheral portion of the electrical part.

* * * * *